US012757744B2

(12) United States Patent
Teng et al.

(10) Patent No.: US 12,757,744 B2
(45) Date of Patent: Oct. 6, 2026

(54) SEMICONDUCTOR STRUCTURE AND ALIGNMENT METHOD THEREOF

(71) Applicant: UNITED MICROELECTRONICS CORP., Hsin-Chu City (TW)

(72) Inventors: Chiao-Yi Teng, Taichung City (TW); Kun-Ju Li, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 415 days.

(21) Appl. No.: 18/522,206

(22) Filed: Nov. 28, 2023

(65) Prior Publication Data

US 2025/0105166 A1 Mar. 27, 2025

(30) Foreign Application Priority Data

Sep. 26, 2023 (TW) ................................ 112136825

(51) Int. Cl.

| | |
|---|---|
| ***H10W 46/00*** | (2026.01) |
| ***H10W 20/00*** | (2026.01) |
| ***H10W 70/60*** | (2026.01) |
| ***H10W 70/63*** | (2026.01) |
| ***H10W 90/00*** | (2026.01) |
| *H10W 72/00* | (2026.01) |
| *H10W 72/90* | (2026.01) |
| *H10W 90/20* | (2026.01) |

(52) U.S. Cl.

CPC ......... *H10W 46/00* (2026.01); *H10W 20/023* (2026.01); *H10W 70/611* (2026.01); *H10W 70/635* (2026.01); *H10W 90/00* (2026.01); *H10W 46/301* (2026.01); *H10W 72/019* (2026.01); *H10W 72/01953* (2026.01); *H10W 72/9445* (2026.01); *H10W 72/957* (2026.01); *H10W 90/297* (2026.01)

(58) Field of Classification Search

CPC . H10W 46/00; H10W 46/301; H10W 20/023; H10W 70/611; H10W 70/635; H10W 90/00; H10W 90/297; H10W 72/019; H10W 72/01953; H10W 72/9445; H10W 72/957

See application file for complete search history.

(56) References Cited

U.S. PATENT DOCUMENTS

| | | | |
|---|---|---|---|
| 6,541,788 | B2 | 4/2003 | Petroff |
| 8,318,579 | B1 | 11/2012 | Wu |
| 8,779,539 | B2 | 7/2014 | Kao |
| 8,810,048 | B2 | 8/2014 | Kuang |
| 10,157,885 | B2 | 12/2018 | Huang |

(Continued)

FOREIGN PATENT DOCUMENTS

| | | | | |
|---|---|---|---|---|
| CN | 116364699 B | * | 8/2023 | ............ H10W 95/00 |
| JP | 2015017940 A | * | 1/2015 | |

OTHER PUBLICATIONS

Grydlik ,Periodical title: Lasing from Glassy Ge Quantum Dots in Crystalline Si ,2016.

*Primary Examiner* — Sitaramarao S Yechuri

(74) *Attorney, Agent, or Firm* — Winston Hsu

(57) ABSTRACT

The invention provides a semiconductor structure, which comprises a first chip and a second chip attached to each other, wherein the first chip comprises a quantum dot pattern, and the second chip comprises a through silicon via (TSV), wherein the quantum dot pattern and the through silicon via are aligned with each other.

18 Claims, 4 Drawing Sheets

(56) References Cited

U.S. PATENT DOCUMENTS

| | | | | |
|---|---|---|---|---|
| 10,297,631 | B2 | 5/2019 | Ho | |
| 11,522,042 | B2 | 12/2022 | Yueh | |
| 2023/0207595 | A1* | 6/2023 | Um | H10F 39/182 257/292 |
| 2024/0170317 | A1* | 5/2024 | Voleti | H10P 72/53 |

* cited by examiner

SEMICONDUCTOR STRUCTURE AND ALIGNMENT METHOD THEREOF

BACKGROUND OF THE INVENTION

1. Field of the Invention

The invention relates to the field of semiconductors, in particular to a semiconductor structure and technical method for aligning quantum dot patterns with through silicon vias.

2. Description of the Prior Art

In the current technology, hybrid bonding technology is a common means. For example, contact structures formed on two different substrates can contact each other and be electrically connected by heterojunction. Compared with connection methods such as wires or forming solders, this bonding method can greatly reduce the area and improve the device density, so hybrid bonding technology is more and more widely used in the field of semiconductor manufacturing.

However, in hybrid bonding technology, the accuracy of device alignment is required, because the size of the device (such as contact structure) is usually small. If the device cannot be aligned accurately, the electrical connection of the device will be affected, and even the whole semiconductor device will not work.

At present, the commonly used alignment method is to form an alignment mark, such as a cross, on the substrate, and then observe the position of the cross mark through the substrate with infrared rays and align it. However, because the substrate is usually made of opaque materials, when more layers of materials are formed on the surface of the substrate, the ability of infrared rays to penetrate the substrate will also decrease, resulting in a decrease in the resolution of the alignment picture that the producer can observe, which is not conducive to the alignment step.

SUMMARY OF THE INVENTION

The invention provides a semiconductor structure, which comprises a first chip and a second chip, wherein the first chip comprises a quantum dot pattern, and the second chip comprises a through silicon via (TSV), wherein the quantum dot pattern and the through silicon via are aligned with each other.

The invention further provides an alignment method of a semiconductor structure, which comprises the following steps: providing a first chip, wherein a surface on the first chip comprises a quantum dot pattern, providing a second chip, wherein the second chip comprises a through silicon via penetrating the second chip, and aligning and bonding the first chip and the second chip, wherein the quantum dot pattern and the through silicon via are aligned with each other.

The invention is characterized in that the alignment of the quantum dot pattern and the trough silicon via is used for positioning and aligning the substrate, instead of the alignment mark and infrared penetration observation in the prior art. Because with more and more material layers formed on the substrate, infrared rays are not easy to completely penetrate the substrate, which leads to the reduction of the resolution of the observation picture during alignment, which is not conducive to the alignment step. In the invention, the quantum dot pattern and the through silicon via are used for alignment, and the characteristic that the quantum dot pattern will emit light after absorbing the light source is combined with the through silicon via, so that the two substrates can be accurately aligned, and the technology of the invention is not limited by the thickness of the substrates, that is to say, the invention is suitable for the alignment steps of substrates with different thicknesses.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
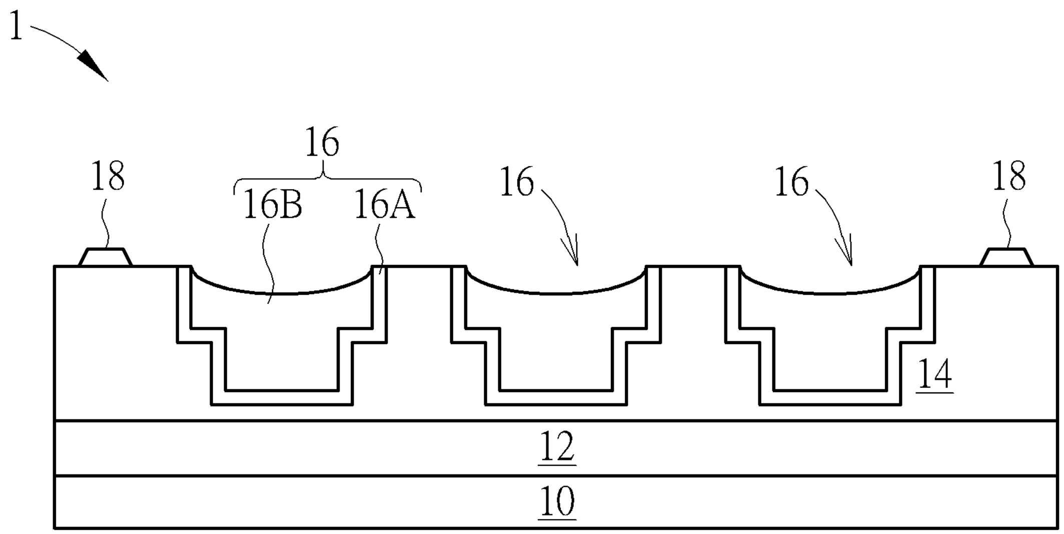
FIG. 1 is a schematic diagram showing the cross-sectional structure of a first chip of the present invention.

Please refer to FIG. 1, which shows a schematic cross-sectional structure of a first chip according to the present invention. As shown in FIG. 1, a first chip 1 is provided. The first chip 1 includes a lower substrate 10, in which a material layer 12, a dielectric layer 14 and a hybrid contact structure 16 may be formed above the lower substrate 10, wherein the materials of the material layer 12 and the dielectric layer 14 are, for example, insulating materials, such as silicon nitride, silicon oxide, silicon oxynitride, nitrogen doped carbide (NDC), ultra-low dielectric constant (ULK) layer. The hybrid contact structure 16 may also include a pad layer 16A and a conductive layer 16B, the pad layer 16A includes titanium nitride (TiN) or tantalum nitride (TaN), etc., and the conductive layer 16B is formed on the pad layer 16A, and the conductive layer 16B may include metals such as tungsten, cobalt, copper, aluminum or other conductive materials, etc., and the present invention is not limited to this.

Figure 2:
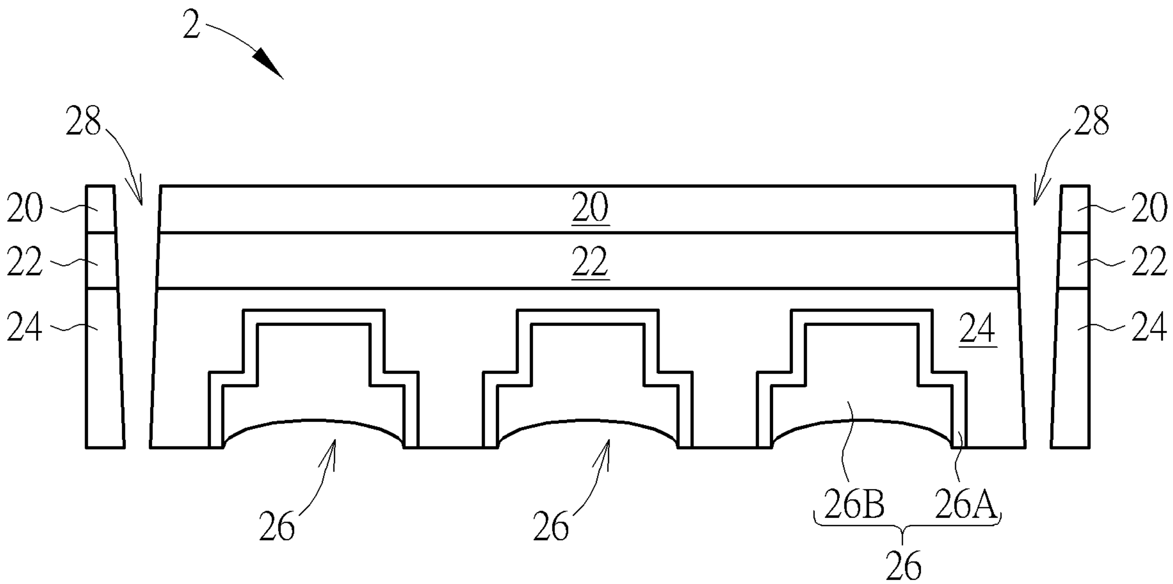
FIG. 2 shows a schematic cross-sectional structure of a second chip of the present invention.

Similarly, FIG. 2 shows a schematic cross-sectional structure of a second chip of the present invention. As shown in FIG. 2, a second chip 2 is provided. The second chip 2 includes an upper substrate 20, in which the upper substrate 20 has a material stacking structure similar to that of the lower substrate 10. For example, a material layer 22, a dielectric layer 24 and a hybrid contact structure 26 may be formed under the upper substrate 20, wherein the materials of the material layer 22 and the dielectric layer 24 are, for example, insulating materials such as silicon nitride, silicon oxide, silicon oxynitride, nitrogen doped carbide (NDC), ultra-low dielectric constant (ULK) layer, but not limited thereto. The hybrid contact structure 26 may also include a pad layer 26A and a conductive layer 26B, the pad layer 26A includes titanium nitride (TiN) or tantalum nitride (TaN) for example, and the conductive layer 26B is formed under the pad layer 26A, and the conductive layer 26B may include metals such as tungsten, cobalt, copper, aluminum or other conductive materials.

In the following steps, the hybrid contact structures 16 and 26 included in the first chip 1 and the second chip 2 will contact and be electrically connected. This way is called hybrid contact technology. However, in the hybrid contact technology, it is very important to align the first chip 1 and the second chip 2. Otherwise, if the first chip 1 and the second chip 2 cannot be aligned, their respective hybrid contact structures will not be contacted and electrically connected.

In addition, it is worth noting that the material layers contained in the first chip 1 and the second chip 2 may be changed according to requirements, that is to say, in other embodiments of the present invention, the upper and lower substrates may each contain more or less material stacked layers, which are within the scope of the present invention.

Figure 3:
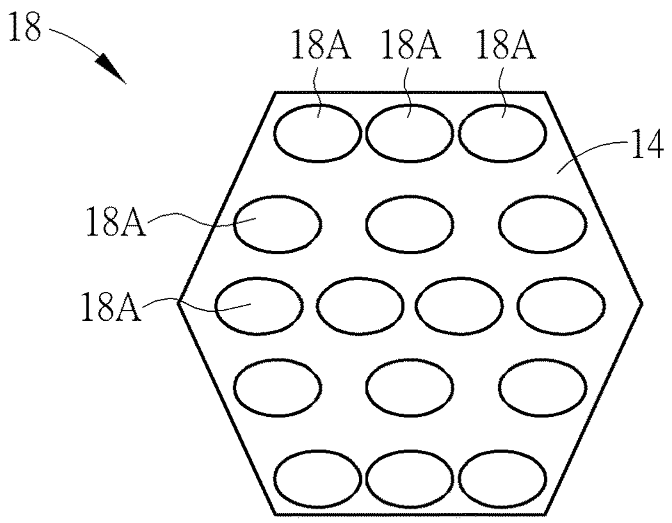
FIG. 3 shows a top view of the quantum dot pattern 18.

In the present invention, at least one quantum dot pattern 18 is formed on the surface of the dielectric layer 14 next to the hybrid contact structure 16 of the first chip 1, the material of the quantum dot pattern 18 may include silicon, germanium, carbon, indium gallium arsenide, gallium arsenide or other materials. Specifically, please refer to FIG. 3, which shows a schematic diagram of the quantum dot pattern 18 from a top view. The quantum dot pattern 18 includes a plurality of quantum dots 18A, the size (diameter) of each quantum dot 18A is preferably less than 100 nm, and the plurality of quantum dots 18A are arranged in an array and combined into the quantum dot pattern 18. Specifically, the quantum dot pattern 18 can be formed by epitaxy, or a seed layer can be formed on the surface of the dielectric layer 24 first, and then a plurality of quantum dots 18A arranged in an array can be formed by atomic layer deposition (ALD) process, as shown in FIG. 3. It should be noted, however, that the above are only some possible methods for forming quantum dot patterns proposed by the present invention, and the present invention is not limited to this, that is to say, other methods for forming quantum dot patterns are also within the scope of the present invention.

In the present invention, when materials such as silicon, germanium, carbon, etc. are made into extremely small sizes (for example, less than 100 nanometers), the crystal of the material itself will generate quantum dot characteristics, that is, the electronic energy level of the material will be discontinuous, resulting in energy band differences. When a material is made into a quantum dot pattern, if it is irradiated by a light source with an appropriate wavelength, the electrons in the material layer will be excited at this time, and the electrons will be promoted from the valence band to the conduction band, and when the light source stops, the electrons will fall back to the valence band from the conduction band and emit fluorescence. The above is a technical overview of the quantum dot pattern, and the quantum dot pattern also belongs to the known technology in the field, so the remaining details are not detailed here.

In addition, at least one through silicon via (TSV) 28 is formed on the surface of the dielectric layer 24 next to the hybrid contact structure 26 of the second chip 2, the through silicon via 28 penetrates the upper substrate 20, the material layer 22 and the dielectric layer 24. In this embodiment, the depth of the through silicon via 28 is not limited, but preferably, when the overall thickness of the second chip 2 (that is, the sum of the thickness of the substrate and the material layer) is greater than 0.1 mm, the infrared ray is not easy to completely penetrate the substrate and the material layer, resulting in the reduction of the resolution of the infrared ray alignment step in the prior art. Therefore, the technical method of the present invention is particularly suitable for the substrate with the overall thickness greater than 0.1 mm.

Figure 4:
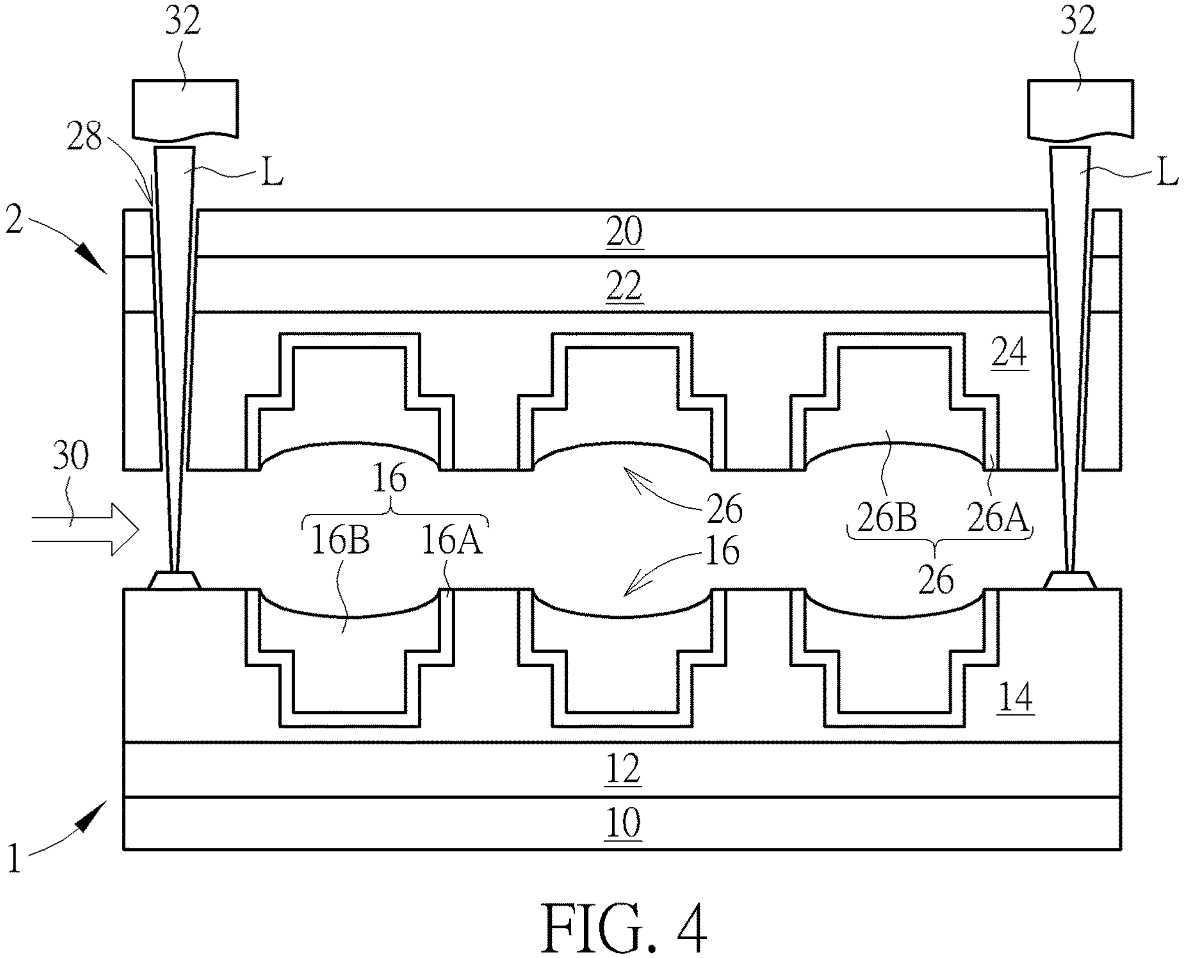
FIGS. 4 to 7 are schematic cross-sectional views of the method for bonding two chips according to one embodiment of the present invention.

FIGS. 4 to 7 are schematic cross-sectional views of the method for bonding two chips according to the present invention. Next, as shown in FIG. 4, the first chip 1 and the second chip 2 are aligned and bonded, wherein in this step, a side light source 30 is provided to irradiate the quantum dot pattern 18, wherein the side light source 30 is, for example, infrared light, visible light or ultraviolet light, and the present invention is not limited to this. When the quantum dot pattern 18 is irradiated by light with a specific wavelength, it will emit light L (such as fluorescence), and the emitted light L will be received by a detector 32 after passing through the through silicon via 28. The detector 32 described here may include a spectrometer, but is not limited thereto.

When the first chip 1 is aligned with the second chip 2, the quantum dot pattern 18 is aligned with the through silicon via 28. At this time, the light L emitted by the quantum dot pattern 18 should pass through the through silicon via 28 to the maximum extent and be sensed by the detector 32, so the detector 32 will receive the light L with the maximum brightness. On the other hand, if the first chip 1 and the second chip 2 are not completely aligned, the light L emitted by the quantum dot pattern 18 cannot pass through the through silicon via 28 or only part of the light passes through the through silicon via 28, so the detector 32 can only receive part of the light L or cannot receive the light. In other words, whether the first chip 1 and the second chip 2 are aligned can be determined by the intensity of light received by the detector 32. The technology of the invention is not limited by the thickness of the substrate, and is suitable for substrate alignment steps with different thicknesses.

Figure 5:
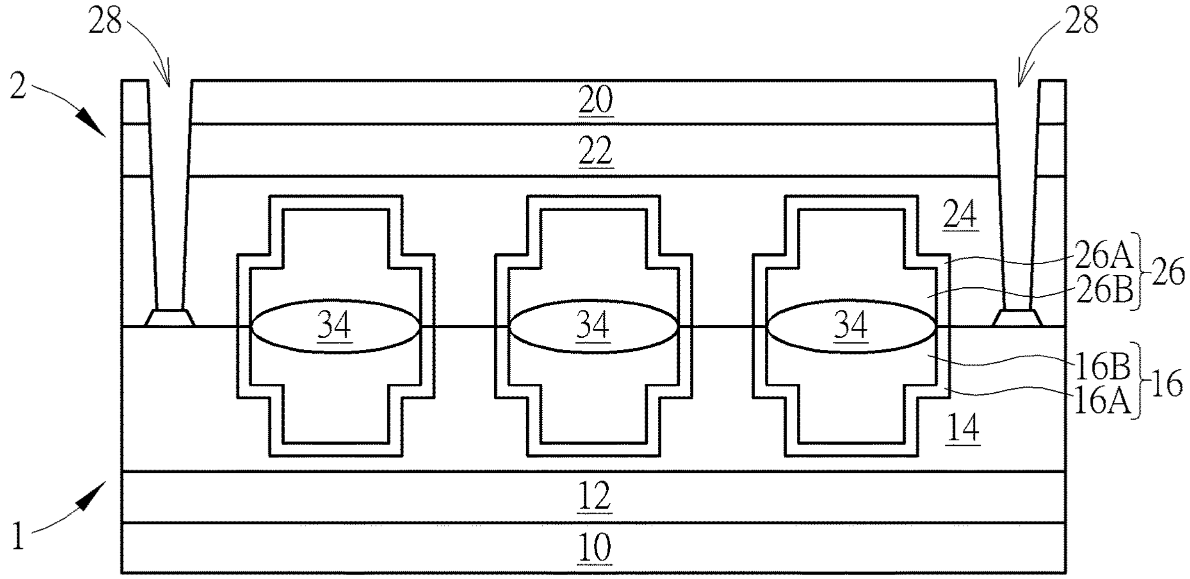
Figure 6:
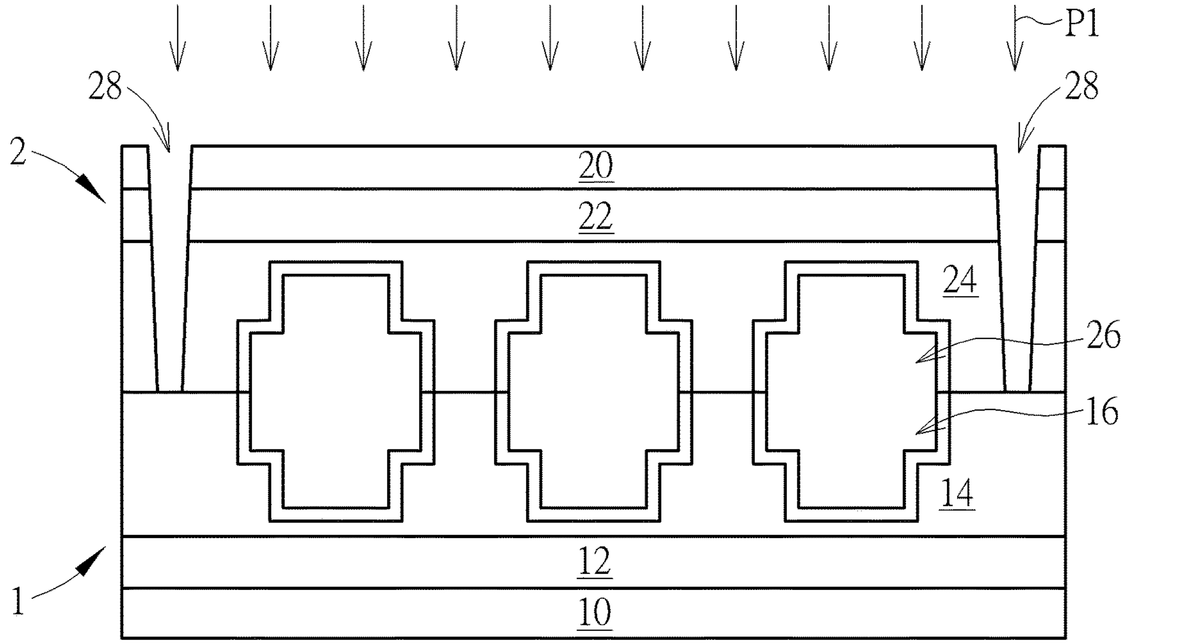

Next, as shown in FIG. 5, the first chip 1 and the second chip 2 are aligned and bonded, and there may still be a gap 34 between the hybrid contact structure 16 and the hybrid contact structure 26. Next, as shown in FIG. 6, an annealing step P1 can be performed, so that the conductive layer 16B and the conductive layer 26B included in the hybrid contact structure 16 and the hybrid contact structure 26 respectively expand and contact with each other, so as to complete the hybrid contact between the first chip 1 and the second chip 2. It is worth noting that in some embodiments, when the quantum dot pattern 18 contains the same elemental composition as the dielectric layer 14 (for example, when both of them contain carbon), the quantum dot pattern 18 may be integrated into the dielectric layer 14 after the annealing step P1, but in other embodiments, if the quantum dot pattern 18 and the dielectric layer 14 do not contain the same elemental composition, the quantum dot pattern 18 may remain on the surface of the dielectric layer 14 after the annealing step P1.

Figure 7:
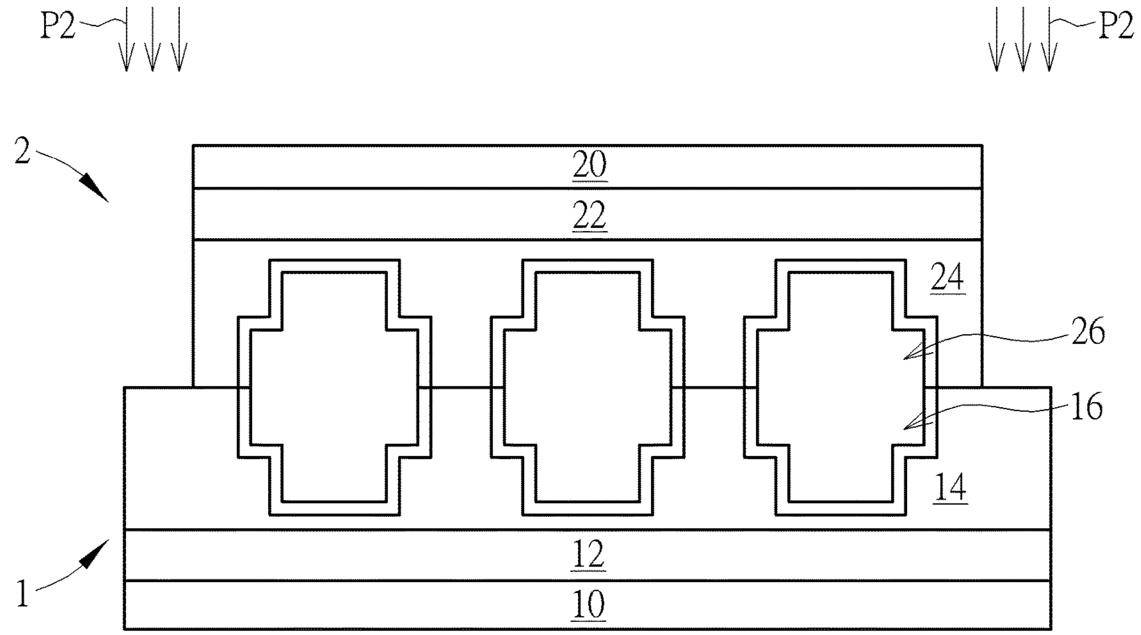

Subsequently, as shown in FIG. 7, in some embodiments, the through silicon via 28 and the quantum dot pattern 18 can be removed by an etching step P2, including removing part of the upper substrate 20, the material layer 22, the dielectric layer 24 and the quantum dot pattern 18 (this etching step will also remove the through silicon via 28). Alternatively, in other embodiments, it is also possible to keep the through silicon vias 28 and the quantum dot patterns 18. These variations are within the scope of the present invention.

Figure 8:
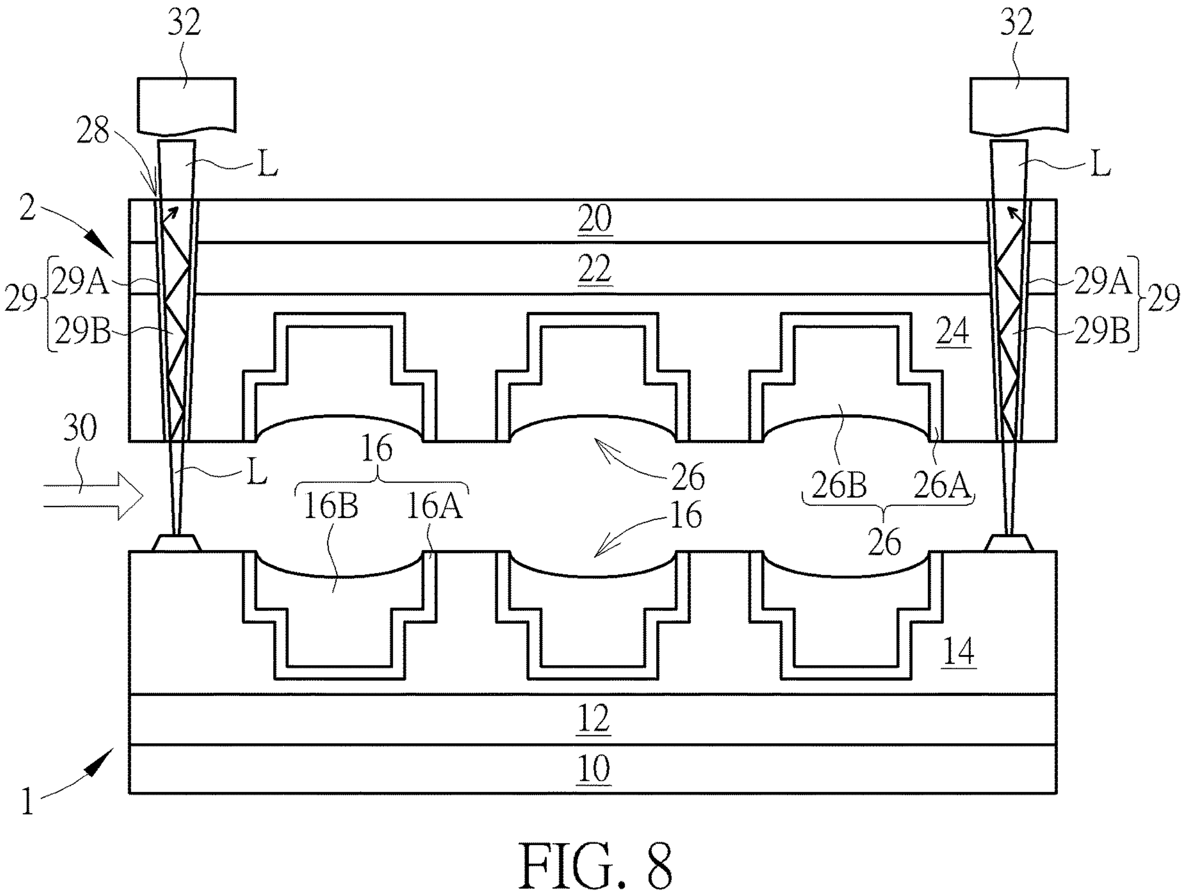
FIG. 8 is a schematic diagram showing the cross-sectional structure of combining two chips according to another embodiment of the present invention.

In another embodiment of the present invention, please refer to FIG. 8, FIG. 8 is a schematic diagram showing the cross-sectional structure of combining two chips according to another embodiment of the present invention. As shown in FIG. 8, some materials can also be filled in the TSV 28 to help light transmission, for example, waveguide material 29 can be filled in the TSV 28, the waveguide material 29 can be similar to optical fiber materials. It may include an outer layer 29A and an inner layer 29B. The outer layer 29A is made of glass or plastic with low refractive index (refractive index, for example, 1.46), and the inner layer 29B is made of glass with high refractive index (refractive index, for example, 1.48). Therefore, when the light source 30 enters the waveguide material 29, the light can be totally reflected in the waveguide material 29 to transmit more light through the TSV 28. Except for the above waveguide materials, other features are the same as those of the above embodiments, and they are not repeated here.

Based on the above description and drawings, the present invention provides a semiconductor structure, which includes a first chip 1 and a second chip 2 bonded to each other, wherein the first chip 1 includes a quantum dot pattern 18, and the second chip 2 includes a through silicon via (TSV) 28, wherein the quantum dot pattern 18 and the through silicon via 28 are aligned with each other.

In some embodiments of the present invention, a first hybrid contact structure 16 is located in the first chip 1 and a second hybrid contact structure 26 is located in the second chip 2, and the first hybrid contact structure 16 and the second hybrid contact structure 26 are in contact and aligned with each other.

In some embodiments of the present invention, the quantum dot pattern 18 includes a plurality of quantum dots 18A arranged in an array.

In some embodiments of the present invention, the width and thickness of each quantum dot 18A are less than 100 nanometers.

In some embodiments of the present invention, the quantum dot pattern 18 has a self-luminous function after being irradiated by a light source 30.

In some embodiments of the present invention, the material of the quantum dot pattern 18 comprises silicon, germanium, indium gallium arsenide and gallium arsenide.

In some embodiments of the present invention, the through silicon vias 28 expose the quantum dot patterns 18.

The invention also provides an alignment method of a semiconductor structure, which comprises providing a first chip 1, wherein a surface of the first chip 1 comprises a quantum dot pattern 18, providing a second chip 2, wherein the second chip 2 comprises a through silicon via 28 penetrating through the second chip 2, and aligning and bonding the first chip 1 and the second chip 2, wherein the quantum dot pattern 18 and the through silicon via 28 are aligned with each other.

In some embodiments of the present invention, it further includes forming a first hybrid contact structure 16 in the first chip 1 and forming a second hybrid contact structure 26 in the second chip 2, wherein the first hybrid contact structure 16 and the second hybrid contact structure 26 are in contact and aligned with each other.

In some embodiments of the present invention, after the first hybrid contact structure 16 and the second hybrid contact structure 26 are in contact with each other and aligned, a gap 34 is further included between the first hybrid contact structure 16 and the second hybrid contact structure 26.

In some embodiments of the present invention, an annealing step P1 is further performed to expand the first hybrid contact structure 16 and the second hybrid contact structure 26, and to shrink or disappear the gap 34.

In some embodiments of the present invention, the quantum dot pattern 18 is irradiated with a light source 30 to make the quantum dot pattern emit light, the through silicon via 28 is aligned with the quantum dot pattern 18, and the light emitted by the quantum dot pattern 18 passes through the through silicon via 28.

In some embodiments of the present invention, a spectrometer (detector 32) is provided to measure the intensity of light L passing through the through silicon via 28, so that the first chip 1 and the second chip 2 are aligned with each other.

In some embodiments of the present invention, the light source 30 irradiates the quantum dot pattern 18 from a gap between the first chip 1 and the second chip 2 (i.e., irradiates the quantum dot pattern from the side).

In some embodiments of the present invention, the material of the quantum dot pattern 18 comprises silicon, germanium, indium gallium arsenide and gallium arsenide.

In some embodiments of the present invention, after the first chip 1 and the second chip 2 are bonded to each other, an etching step P2 is performed to remove the quantum dot pattern 18 on the first chip 1 and the through silicon via 28 on the second chip 2.

The invention is characterized in that the alignment of the quantum dot pattern and the trough silicon via is used for positioning and aligning the substrate, instead of the alignment mark and infrared penetration observation in the prior art. Because with more and more material layers formed on the substrate, infrared rays are not easy to completely penetrate the substrate, which leads to the reduction of the resolution of the observation picture during alignment, which is not conducive to the alignment step. In the invention, the quantum dot pattern and the through silicon via are used for alignment, and the characteristic that the quantum dot pattern will emit light after absorbing the light source is combined with the through silicon via, so that the two substrates can be accurately aligned, and the technology of the invention is not limited by the thickness of the substrates, that is to say, the invention is suitable for the alignment steps of substrates with different thicknesses.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:

a first chip and a second chip attached to each other, wherein the first chip contains a quantum dot pattern and the second chip contains a through silicon via (TSV), wherein the quantum dot pattern and the through silicon via are aligned with each other; and a waveguide material disposed in the through silicon via, wherein the waveguide material comprises an outer layer and an inner layer, and wherein the outer layer has a lower refractive index than the inner layer such that light is totally reflected in the waveguide material.

2. The semiconductor structure according to claim 1, further comprising a first hybrid contact structure located in the first chip and a second hybrid contact structure located in the second chip, wherein the first hybrid contact structure and the second hybrid contact structure are in contact and aligned with each other.

3. The semiconductor structure according to claim 1, wherein the quantum dot pattern comprises a plurality of quantum dots arranged in an array.

4. The semiconductor structure according to claim 3, wherein a width and a thickness of each quantum dot are less than 100 nm.

5. The semiconductor structure according to claim 1, wherein the quantum dot pattern has a self-luminous function after being irradiated by a light source.

6. The semiconductor structure according to claim 1, wherein the material of the quantum dot pattern comprises silicon, germanium, indium gallium arsenide and gallium arsenide.

7. The semiconductor structure according to claim 1, wherein the through silicon via exposes the quantum dot pattern.

8. An alignment method of a semiconductor structure, comprising:
- providing a first chip, wherein a surface on the first chip comprises a quantum dot pattern;
- providing a second chip, which includes a through silicon via penetrating the second chip;
- aligning and attaching the first chip and the second chip, wherein the quantum dot pattern and the through silicon via are aligned with each other; and
- performing an etching step to remove the quantum dot pattern on the first chip and the through silicon via of the second chip after the first chip and the second chip are bonded to each other.

9. The alignment method of a semiconductor structure according to claim 8, further comprising forming a first hybrid contact structure in the first chip and forming a second hybrid contact structure in the second chip, wherein the first hybrid contact structure and the second hybrid contact structure are in contact with each other and aligned.

10. The alignment method of a semiconductor structure according to claim 9, wherein after the first hybrid contact structure and the second hybrid contact structure are in contact with each other and aligned, a gap is included between the first hybrid contact structure and the second hybrid contact structure.

11. The alignment method of a semiconductor structure according to claim 10, further comprising performing an annealing step to expand the first hybrid contact structure and the second hybrid contact structure, and to narrow or disappear the gap.

12. The alignment method of a semiconductor structure according to claim 8, wherein the quantum dot pattern comprises a plurality of quantum dots arranged in an array.

13. The alignment method of semiconductor structure according to claim 12, wherein a width and a thickness of each quantum dot are less than 100 nm.

14. The alignment method of a semiconductor structure according to claim 8, further comprising:
- irradiating the quantum dot pattern with a light source to make the quantum dot pattern emit light;
- aligning the through silicon via with the quantum dot pattern, and make the light emitted by the quantum dot pattern pass through the through silicon via.

15. The alignment method of a semiconductor structure according to claim 14, further comprising providing a spectrometer to measure the intensity of the light passing through the through silicon via, so that the first chip and the second chip are aligned with each other.

16. The alignment method of a semiconductor structure according to claim 14, wherein the light source irradiates the quantum dot pattern from a gap between the first chip and the second chip.

17. The alignment method of a semiconductor structure according to claim 8, wherein the material of the quantum dot pattern comprises silicon, germanium, indium gallium arsenide and gallium arsenide.

18. The alignment method of a semiconductor structure according to claim 8, further comprising filling a waveguide material in the through silicon via.

* * * * *